(12) United States Patent
Hsu et al.

(10) Patent No.: US 9,608,179 B2
(45) Date of Patent: Mar. 28, 2017

(54) SMD TYPE LED PACKAGE DEVICE, METHOD FOR MANUFACTURING THE SAME, AND LIGHT-EMITTING APPARATUS

(71) Applicant: POWERLED ELECTRONIC CO., LTD., New Taipei (TW)

(72) Inventors: Wei Pin Hsu, New Taipei (TW); Teh Yang Lin, New Taipei (TW)

(73) Assignee: Powerled Electronic Co., Ltd., New Taipei (TW)

( * ) Notice: Subject to any disclaimer, the term of this patent is extended or adjusted under 35 U.S.C. 154(b) by 0 days.

(21) Appl. No.: 14/864,065

(22) Filed: Sep. 24, 2015

(65) Prior Publication Data
US 2016/0133797 A1 May 12, 2016

(30) Foreign Application Priority Data

Nov. 6, 2014 (TW) .............. 103138526 A (51) Int. Cl.
*H01L 33/54* (2010.01)
*H01L 33/48* (2010.01)
*H01L 33/62* (2010.01)

(52) U.S. Cl.
CPC ............ *H01L 33/54* (2013.01); *H01L 33/483* (2013.01); *H01L 33/62* (2013.01); *H01L 2224/48247* (2013.01); *H01L 2924/181* (2013.01); *H01L 2933/005* (2013.01); *H01L 2933/0033* (2013.01)

(58) Field of Classification Search
None
See application file for complete search history.

(56) References Cited

U.S. PATENT DOCUMENTS

| 5,981,979 A | 11/1999 | Brunner | |
|---|---|---|---|
| 6,045,365 A | 4/2000 | Kihara | |
| 6,340,824 B1* | 1/2002 | Komoto | H01L 33/507 257/100 |
| 7,619,260 B2 | 11/2009 | Takekuma | |
| 7,868,334 B2 | 1/2011 | Hata et al. | |
| 2003/0002272 A1* | 1/2003 | Suehiro | H01L 33/505 362/84 |
| 2011/0248836 A1* | 10/2011 | Brandes | H01L 25/167 340/332 |
| 2012/0104426 A1* | 5/2012 | Chan | H01L 25/0753 257/89 |
| 2012/0267661 A1* | 10/2012 | Kim | H01L 33/486 257/98 |
| 2012/0299036 A1* | 11/2012 | Liu | H01L 33/56 257/98 |
| 2013/0161672 A1* | 6/2013 | Hsieh | H01L 33/58 257/98 |

* cited by examiner

*Primary Examiner* — Bilkis Jahan
(74) *Attorney, Agent, or Firm* — Kolisch Hartwell, P.C.

(57) ABSTRACT

Disclosed is a SMD type LED package device, a method for manufacturing the same, and a light-emitting apparatus, wherein the surface-mount-device (SMD) type light-emitting diode (LED) package device comprises an assembly of an LED chip, two metal supporting frames, and a packaging body. The two metal supporting frames of the assembly are spaced apart from each other and disposed in parallel along the first axis. Each metal supporting frame has a first end electrically connected to the LED chip and a second end opposite to the first end. The packaging body has a lens portion and a supporting portion, which is integrally formed with the packaging body and covers the LED chip and the first ends of the metal supporting frames.

6 Claims, 7 Drawing Sheets

SMD TYPE LED PACKAGE DEVICE, METHOD FOR MANUFACTURING THE SAME, AND LIGHT-EMITTING APPARATUS

CROSS-REFERENCE TO RELATED APPLICATION

This application claims priority to Taiwanese Patent Application No. 103138526, filed Nov. 6, 2014, which is hereby incorporated by reference.

FIELD OF THE INVENTION

The present invention relates to a light-emitting apparatus, and particularly to a light-emitting apparatus having a light-emitting diode (LED) package device which is suitable for being assembled by surface-mount technology (SMT), a method for manufacturing the same, and an LED package device.

BACKGROUND OF THE INVENTION

Figure 1:
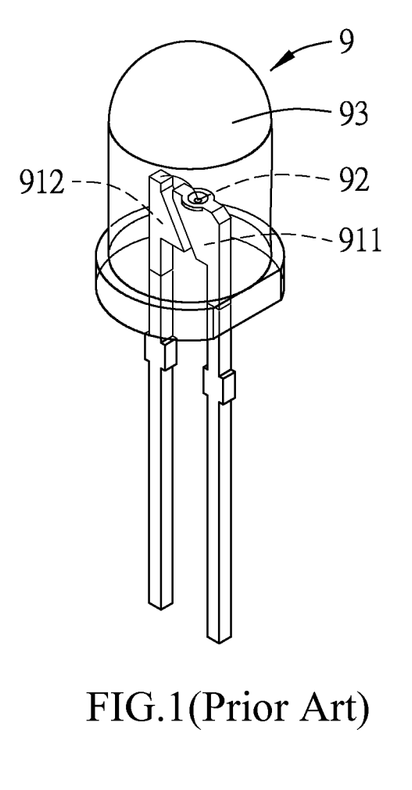
FIG. 1 is a semi-transparent isometric view of a prior LED package device.

Please refer to FIG. 1. A prior LED package device 9 comprises two metal supporting frames 911 and 912, an LED chip 92 mounted on the metal supporting frames 911 and electrically connected to another metal supporting frame 912 via a metallic conducting wire, and an injection-molded packaging body 93 encapsulating the LED chip 92.

Figure 2:
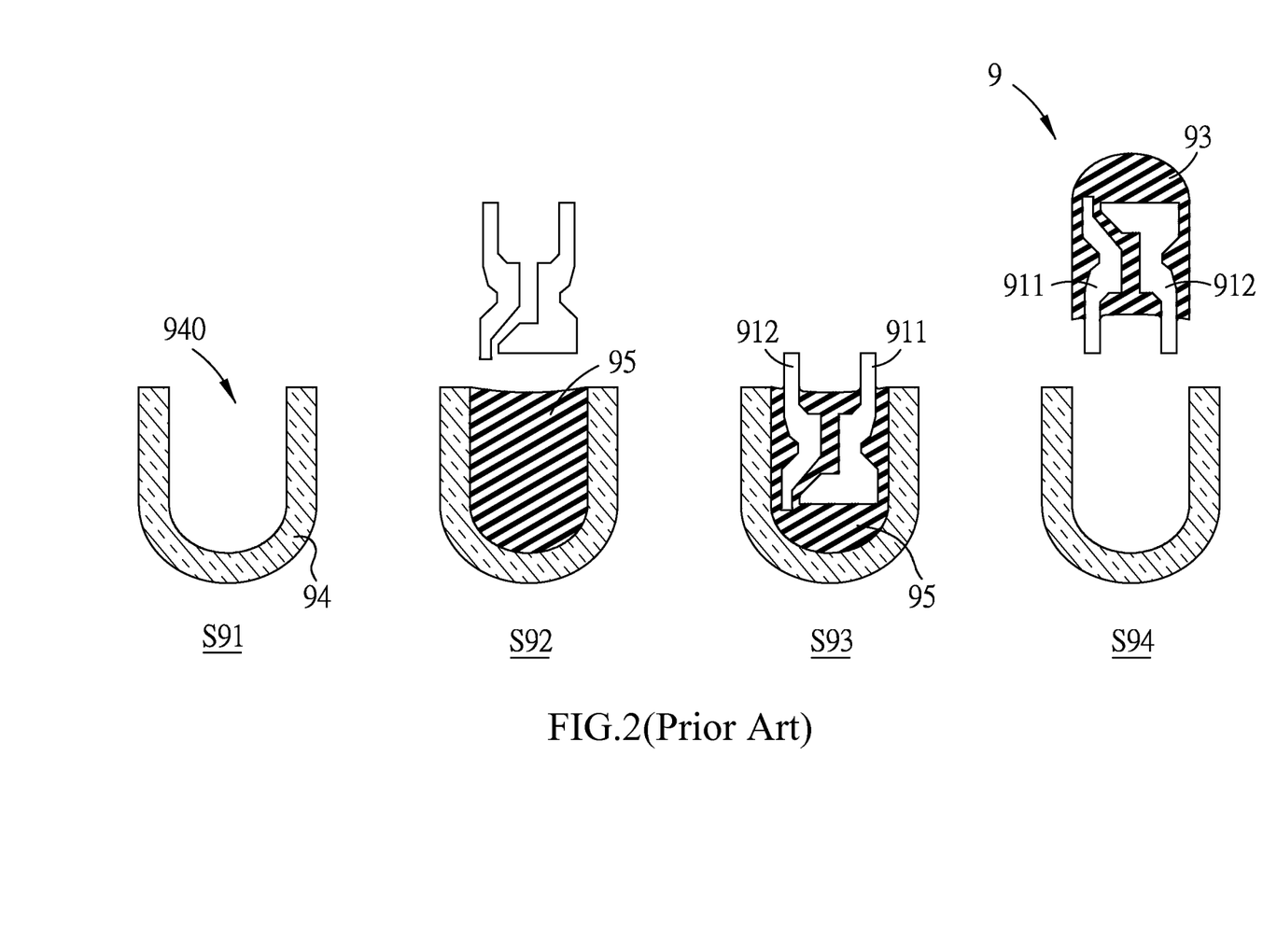
FIG. 2 is a flow chart illustrating the manufacturing process of the prior LED package device.

Please refer to FIG. 2 for the manufacturing method of the foregoing prior LED package device comprises steps as follows:

S91: providing a mold 94 having a mold cavity 940;
S92: injecting an encapsulant 95 into the mold cavity 940;
S93: plugging an assembly of the metal supporting frames 911, 912 and the LED chip 92 into the encapsulant 95, and then curing the encapsulant 95; and
S94: performing mold release and thus obtaining a complete packaging body 9, in which the above mentioned encapsulant 95 forms the packaging body 93 via the curing process.

The method for assembling the prior LED package device 9 is: inserting the metal supporting frames 911, 912 through the predetermined perforations on a circuit board substrate (not shown in the drawings), and then soldering a portion of the metal supporting frames 911, 912 protruding out of the lower surface of the circuit board substrate to achieve electrical connection and to fix the LED package device to the circuit substrate.

Because the prior LED package device 9 is durable, and the light-emitting angle thereof is easy to be controlled via the design of a lens portion, the prior LED package device 9 is still being widely applied to various fields, wherein one of the main fields to which the traditional LED package device is applied is the outdoor digital signage.

Nonetheless, with the increasing demand of higher resolution of the outdoor digital signage, the LED package device 9 must be arranged more tightly to increase the density of the light-emitters on the circuit board substrate. In the foregoing assembling method, i.e., inserting the metal supporting frames through the predetermined perforations of the circuit substrate, the metal supporting frames are electrically connected to the circuit board substrate via utilizing the upper surface and the lower surface. The circuit on the substrate has to be designed in a complex manner in order to increase the density of light emitters. Therefore, if a new manufacturing method is provided wherein the advantage of the LED package device 9, namely the durability and the ease control of light emitted angle, is kept while the Surface-Mount Technology (SMT) is adopted as the new assembling method, thereby the LED package device being assembled on only one side of a circuit board method, it will greatly reduce the difficulties existing in the assembly process and the complexity of the circuit board design.

However, due to the limitation of prior-molding manufacturing process, the LED package device cannot stand on the ground with the metal supporting frames 911, 912 protruding out of the bottom surface of the packaging body 93. Also, the bottom surface of the packaging body 9 is uneven due to the protuberant parts around the metal supporting frames 911, 912, which are caused by capillarity phenomena.

In the prior arts, there are some improvements on the prior LED package device 9 by modifying the traditional LED package device 9 as being compatible with SMT assembling processes. For example, the U.S. Pat. No. 5,981,979 discloses a side-lying type LED package device in which the metal supporting frames cannot stand on the circuit board substrate and therefore the LED package device disclosed by U.S. Pat. No. 5,981,979 can only be assembled via SMT in side-lying manner.

Nevertheless, the metal supporting frames of this kind of LED package device need to be bent, and this kind of LED package device can only be applied to lateral emitting products.

There are also other advanced designs for similar packaging devices such as a mini bulb, which enable those package devices to stand on circuit board substrates and be assembled thereon. For example, the U.S. Pat. No. 6,045,365 discloses a device comprising a base component on which a mini bulb is mounted, and an installation body with circuit connector for the base component to be inserted in, wherein the installation body can stand. However, such devices comprise more components and have more complex manufacturing procedures.

U.S. Pat. No. 7,619,260 discloses a supporting member perpendicularly engages with the metal supporting frames. The supporting member along with the ends of the metal supporting frames enables the LED package device to stand despite the uneven bottom surface, and thus the LED package device can be assembled via SMT. However, such design also requires additional components and is demanding in the molding process.

U.S. Pat. No. 7,868,334 discloses an LED package device that is able to stand via two bent and parallel metal supporting frames, by which the packaging LED device can be surface-mounted via SMT. In this design, the metal supporting frames need to be bent to form a tridimensional standing structure, and the numerous bending operations lead to accumulated tolerance.

SUMMARY OF THE INVENTION

Consequently, the primary object of the present invention is to provide a surface-mount-device (SMD) type LED package device which is able to stand without the aid of extra components, to thus solve the problems existed in prior arts.

In another aspect of the present invention, the present invention provides a manufacturing method of the SMD type LED package device.

In another aspect of the present invention, the present invention provides a light-emitting apparatus equipped with the SMD type LED package device.

Accordingly, the present invention provides a SMD type LED device, comprising an LED chip, a first metal supporting frame, a second metal supporting frame and a packaging body.

The first metal supporting frame has a first end on which the LED chip is mounted and a second end opposite to the first end on a first axis. The second metal supporting frame is spaced apart from the first metal supporting frame, having a first end of the second metal supporting frame and a second end which is disposed oppositely to the first end of the second metal supporting frame on the first axis, wherein the LED chip is electrically connected to the first end of the second metal supporting frame through a conducting wire.

The packaging body includes a lens portion and a supporting portion. The lens portion covers the LED chip, the first end of the first metal supporting frame and the first end of the second metal supporting frame. The lens portion has a light-emitting surface whose center is an optical axis extending along the first axis. The supporting portion is integrally formed with the lens portion on a side opposite to the light-emitting surface of the lens portion. The supporting portion includes a circumferential surface which surrounds the optical axis, and a bottom surface which is adjacent to the circumferential surface and which is disposed on a side far away from the lens portion. A plurality of points on the bottom surface forms a supporting stand on a predetermined assembling plane, in such a manner that the second end of the first metal supporting frame together with the peripheral portion thereof and the second end of the second metal supporting frame together with the peripheral portion thereof are respectively provided to extend outwardly from the bottom surface towards the outside of the packaging body to share the same predetermined assembling plane with the supporting stand of the bottom surface.

The object of the present invention can further be achieved via technical means as follows.

In one aspect of the present invention, the supporting portion of the packaging body includes the supporting stand which is annular shaped and is defined by enormous numbers of points on the bottom surface, or a plurality of points spaced apart from each other on the bottom surface.

In one aspect of the present invention, the angle between the predetermined assembling plane and the first axis is in a range from 60° to 90°.

In one aspect of the present invention, a silhouette of the supporting portion of the packaging body projected from a projection direction along the first axis is a polygon, and the supporting portion further includes a plurality of supporting stands which are respectively located at the vertices of the polygon.

Accordingly, a manufacturing method of the SMD type LED package device of the present invention comprises the following steps:

a. injecting an encapsulant into an opening of a mold cavity.

b. plugging an assembly of metal supporting frames and an LED chip into the mold cavity injected with the encapsulant, wherein the assembly includes an LED chip, and two metal supporting frames spaced from and parallel to each other, wherein the LED chip is electrically connected to each first end of the two metal supporting frames, and wherein in this step the LED chip and the first ends of the two metal supporting frames are encapsulated by the encapsulant injected in step a;

c. curing the encapsulant and then performing mold release to obtain a semi-finished product, by which the injected encapsulant forms a packaging body including a lens portion and a supporting portion which is integrally formed with the lens portion and is close to the opening of the mold cavity when the semi-finished product is in the mold cavity, wherein the lens portion includes an optical axis, and a light-emitting surface whose center is the optical axis, and wherein the supporting portion includes a circumferential surface surrounding the optical axis; and d. cutting the semi-finished product obtained in step c in such a manner that each of the two metal supporting frames is provided with a second end which is far away from the lens portion on the first axis that parallels the optical axis; furthermore, the supporting portion of the packaging body includes a bottom surface which is far away from the lens portion, wherein a plurality of points on the bottom surface define a supporting stand on a predetermined assembling plane in such a manner that the second ends of the two metal supporting frames together with the peripheral portions thereof are respectively provided to extend outwardly form the bottom surface toward the outside of the packaging body to share the same predetermined assembling plane with the supporting stand of the bottom surface.

In addition, the object of the present invention can further be achieved via technical means as follows.

In one aspect of the present invention, the angle between the predetermined assembling plane and the first axis is in a range from 60° to 90°.

In one aspect of the invention, the surfaces of the two metal supporting frames are partially processed before step b to increase the contact angle between the encapsulant and the two metal supporting frames.

In one aspect of the invention, the mold cavity comprises a cave bottom part, a main body part and a supporting portion forming part that are sequentially connected, and wherein the supporting portion forming part is close to the opening, the encapsulant is injected into the cave bottom part and the main body part to form the lens portion, and the encapsulant injected into the supporting portion forming part rises by capillary action to form the supporting stand.

Accordingly, a light-emitting apparatus of the present invention comprises at least one circuit board substrate and at least one SMD type LED package device which is assembled on the circuit board substrate via surface-mount technology manufacturing process. The SMD type LED package device has the structure described hereinbefore, wherein the LED package device is mounted on the surface of the circuit board substrate by connecting the supporting stand and the second ends to the circuit board substrate.

The beneficial effect of the present invention resides in: via the supporting portion along with the metal supporting frames, the LED package device is provided with advantage that it is able to be assembled by SMT without the consumption of any additional components.

BRIEF DESCRIPTIONS OF THE DRAWINGS

Other features and advantages of the present invention will be readily appreciated upon reference to the detailed descriptions of the preferred embodiments with the accompanying drawings, wherein.

DETAILED DESCRIPTION OF THE PREFERRED EMBODIMENTS

The aforementioned and other technical means, features and advantages of the present invention will be readily appreciated upon reference to the following description of the preferred embodiments with the accompanying drawings.

Figure 3:
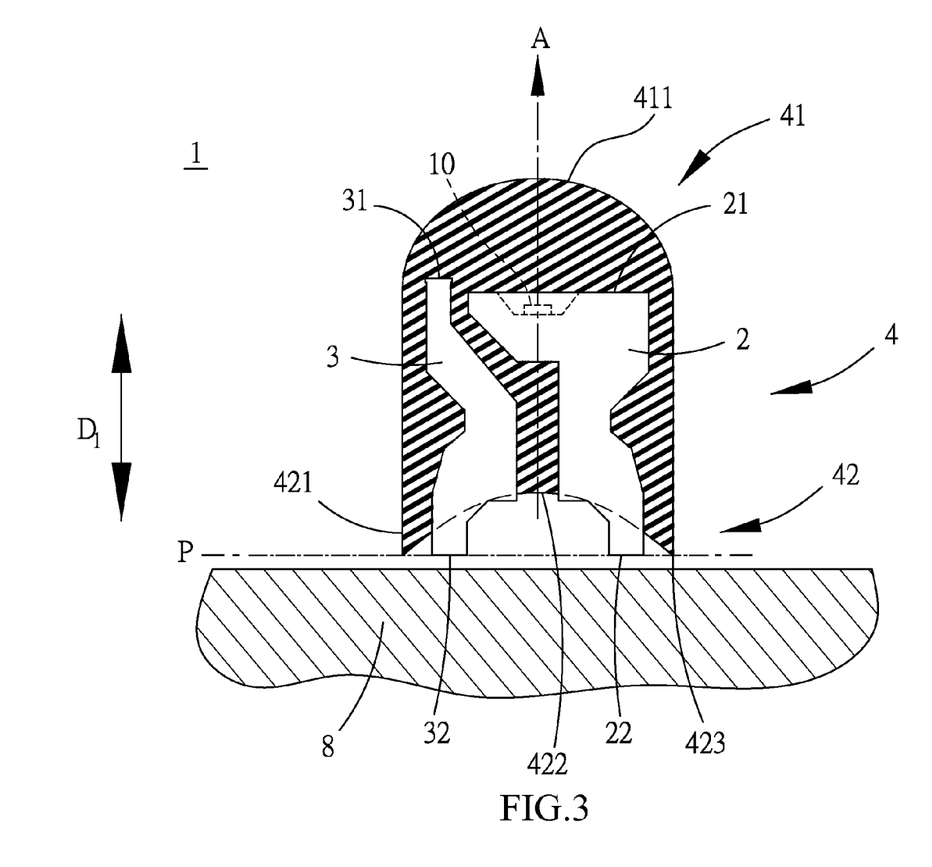
FIG. 3 is a schematic view illustrating the light-emitting apparatus of present invention comprising a circuit board substrate and a SMD type LED package device in which the SMD type LED package device is going to be mounted on the surface of the circuit board substrate.

Please refer to FIG. 3, which shows a light-emitting apparatus of the present invention comprising a circuit board substrate 8 and a SMD type LED package device assembled on the circuit board substrate 8 via SMT manufacturing process. The amount of the LED package device 1 in the light-emitting apparatus is not limited to one. The amount of the LED package device and the arrangement pattern thereof differ from different practical applications. For example, if the light-emitting apparatus is a digital signage, then a plurality of LED package devices 1 are provided and arranged in an array; if the light-emitting apparatus is a flashlight or a lamp, one LED package devices 1 is provided, or a plurality of the LED package devices are provided and arranged in spaced distances.

The first embodiment of the present invention provides SMD type LED package device comprising an LED chip 10, a first metal supporting frame 2, a second metal supporting frame 3 and a packaging body 4.

The first metal supporting frame 2 has a first end 21 on which the LED chip 10 is mounted and a second end 22 opposite to the first end 21 on a first axis $D_1$.

The second metal supporting frame 3 is spaced apart from the first metal supporting frame 2, having a first end 31 of the second metal supporting frame 3 and a second end 32 which is disposed oppositely to the first end 31 of the second metal supporting frame 3 on the first axis $D_1$, wherein the LED chip 10 is electrically connected to the first end 31 of the second metal supporting frame 3 through a conducting wire (not shown in the drawings).

The packaging body 4 has a lens portion 41 having a circular silhouette projected from a direction along the first axis $D_1$, and a supporting portion 42 which is integrally formed with the lens portion 41. The lens portion 41 covers the LED chip 10, the first end 21 of the first metal supporting frame 2 and the first end 31 of the second metal supporting frame 3. The lens portion 41 has a light-emitting surface 411 whose center is an optical axis A extending on the first axis $D_1$. The light emitted from the LED chip 10 is refracted by the lens portion 41 and radiated through the light-emitting surface 411 within a predetermined range of emergence angle.

The supporting portion 42 is integrally formed with the lens portion 41 on a side opposite to the light-emitting surface 411 of the lens portion 41. It maintains the relative position between the first metal supporting frame 2 and the second metal supporting frame 3. The supporting portion 42 includes a circumferential surface 421 which surrounds the optical axis A, and a bottom surface 422 disposed on a side far away from the lens portion 41 and adjacent to the circumferential surface 421. In this embodiment, the silhouette of the supporting portion 42 projected from a direction along the first axis $D_1$ matches the outline of the lens portion 41. Moreover, due to the effect of capillarity in the manufacturing process of the packaging body 4, the bottom surface 422 becomes an inward-curving arc surface that has a protuberant circumferential part and a concave center part. Enormous numbers of points on the bottom surface 422 define a circular supporting stand 423 on a predetermined assembling plane P. The above-mentioned second end 22 of the first metal supporting frame 2 along with the periphery thereof and the second end 32 of the second metal supporting frame 3 along with the periphery thereof extend outwardly form the bottom surface 422 to the outside of the packaging body 4 and share the same plane, i.e. the predetermined assembling plane, with the supporting stand 423. In this embodiment, the included angle between the predetermined assembling surface P and the first axis $D_1$ is 90°. However, the present invention is not limited to this angle; in other embodiment, the included angle can be specified in a range from 60° to 90° according to altered demand.

The "sharing the same predetermined assembling plane" refers to sharing the same plane within a permitted tolerance in the subsequent assembly process. More specifically, due to the thickness of a tin solder or an anti-solder layer, the second end 22 of the first metal supporting frame 2 and the second end 32 of the second metal supporting frame 3 share the same plane with the supporting stand 423 with a tolerance less than 0.5 mm in the direction along the first axis $D_1$.

By the structural design that the supporting stand 423, the second end 22 of the first metal supporting frame 2 and the second end 32 of the second metal supporting frame 3 share the same plane, the LED package device 1 can stand on the circuit board substrate 8 to facilitate the SMT assembly process.

Figure 4:
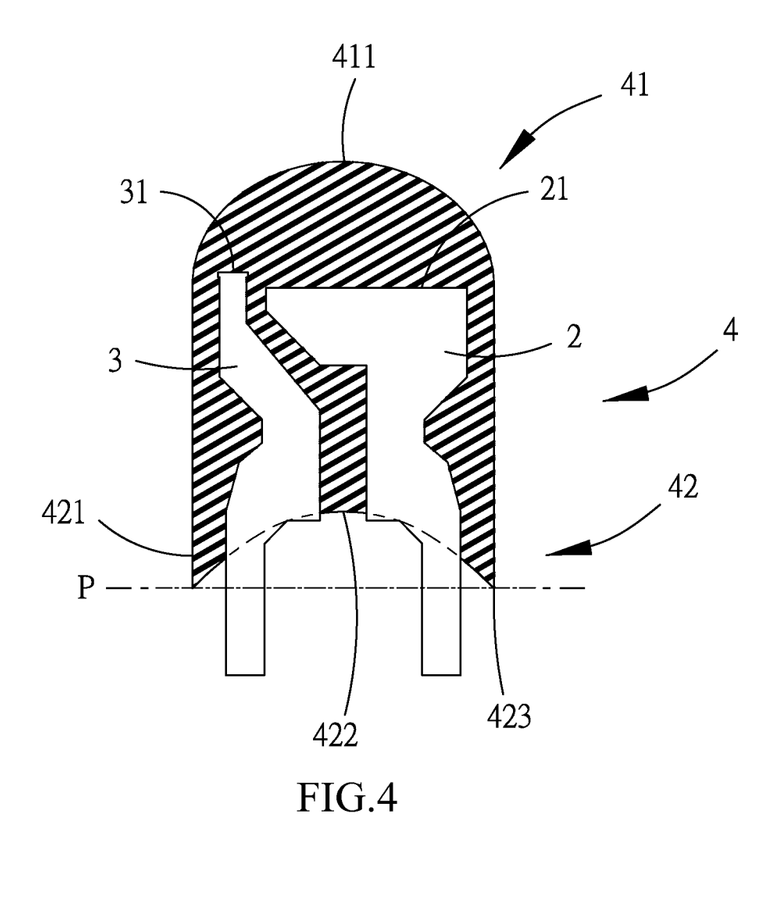
FIG. 4 is a schematic view illustrating the SMT type LED package device of FIG. 3 is obtained by cutting along the predetermined assembling plan.

Please refer to FIG. 4 for the manufacturing method of the LED package device 1 in this embodiment comprises the following steps:

Firstly, injecting encapsulant into an opening of a mold cavity, and partially processing the surfaces of the two metal supporting frames in advance, which refers to coating a separation agent or solderability preservatives to the parts opposite to the first ends 21, 31 to increase the contact angle between the encapsulant and the two metal supporting frames 2, 3. Specifically, if a separation agent is applied, then an extra washing process is necessary. The type of separation agent applied in this embodiment is KS-707 produced by TOPCO Corporation, and the washing process is implemented with toluene. Certainly, to increase the contact angle, other types of separation agents are also applicable; the present invention is not limited to this. If a solderability preservative is applied, then after the manufacturing process the products need high temperature sublimation procedure to prevent possible difficulties that may affect the subsequent soldering.

Next, plugging an assembly of the first metal supporting frame 2, the second metal supporting frame 3 and the LED chip 10 into the mold cavity injected with the encapsulant in such a manner that the LED chip 10, the first ends 21, 31 of the first and second metal supporting frame 2, 3 are encapsulated by the injected encapsulant.

Next, curing the encapsulant and then performing mold release to obtain a semi-finished product as shown in FIG. 4. It is noted that the surfaces of the two metal supporting frame 2, 3 has been partially processed in advance, so the contact angle between the injected encapsulant and the two metal supporting frames 2, 3 is large enough that the encapsulant reduces contact with the two metal supporting frame 2, 3, and thus the encapsulant has decreased tendency to rise, and thereby the semi-finished product is formed as shown in FIG. 4. The semi-finished product comprises the packaging body 4, and the supporting portion 42 thereof includes the bottom surface 422 which is a inward-curving arc surface and the circular shaped supporting stand 423 located on the predetermined assembling plane P.

Finally, cutting the semi-finished product using a milling cutter or diagonal pliers to form the two second ends 22, 32 of the first and second metal supporting frames 2, 3 in align with the predetermined assembling plane P in such a manner that the two second end 22, 32 share the same plane, i.e., the predetermined assembling plan P, with the supporting stand 423.

In this embodiment, the included angle between the predetermined assembling plane P and the first axis $D_1$ is 90°, but the present invention is not limited to this. In other embodiment, the included angle can be an angle other than 90°. Nonetheless, in order to make the SMT packaging LED device 1 stand steadily, the preferred included angle between the predetermined assembling plane P and the first axis $D_1$ is in a range from 60° to 90°.

Figure 5:
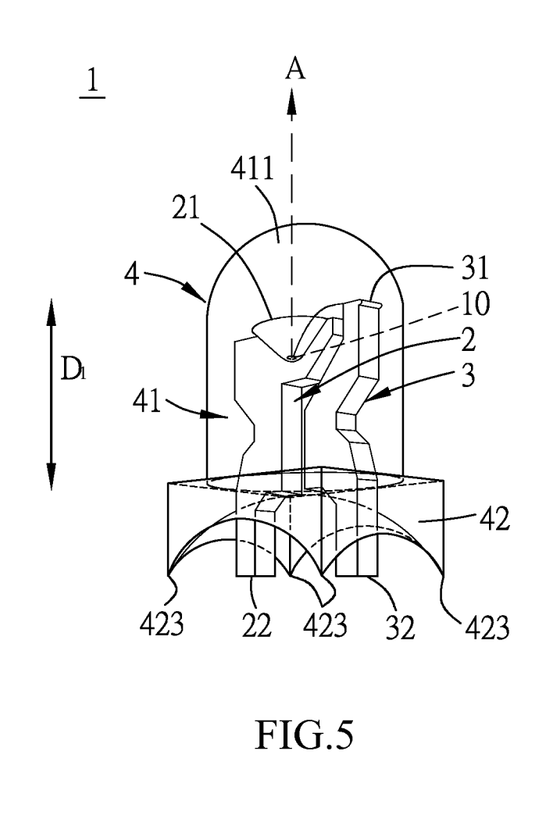
FIG. 5 is a semi-transparent isometric view illustrating another aspect of the SMD type LED package device.

It is noted that, in the foregoing embodiment, the shape of the supporting portion 42 and the type of the supporting stand 423 is not limited. The silhouette of the supporting portion 42 projected from the direction along the first axis $D_1$ varies according to the shape of the mold of the packaging body 4 and the manufacturing method thereof. For example, if the portion of the mold corresponding to the supporting portion 42 is a large circle, then the finished packaging body 4 has supporting portion 42 as a shoulder portion. Another example is shown in FIG. 5, in which the portion of the mold corresponding to the supporting portion 42 is a rectangular body including four angles, and in which the encapsulant rises by capillary action on the four angles, then the projection silhouette of the supporting portion 42 projected from the direction along the first axis is a rectangle. The supporting stand 423 is in a form of four spaced apart points, or four L-shaped or arc-shaped lines (so called radius angle).

Figure 6:
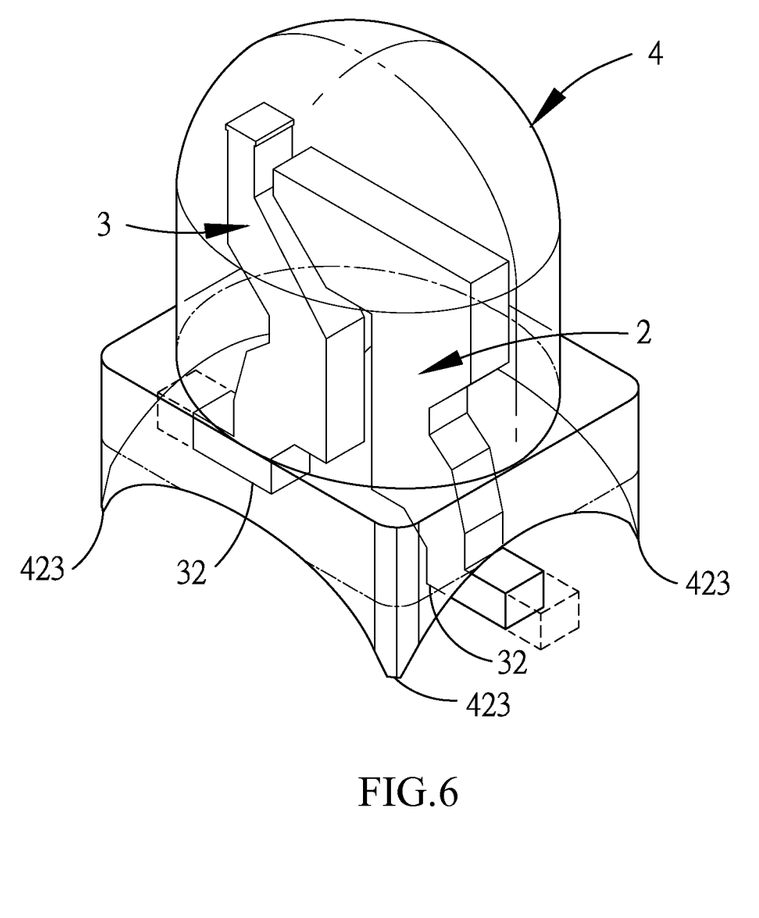
FIG. 6 is a semi-transparent isometric view illustrating that the SMD type LED package device is obtained via cutting off the part depicted by dashed line.

In addition, with reference to FIG. 6, in the manufacturing process of the SMD type LED package device in this embodiment, a semi-finished product shown in FIG. 6 can be formed after the curing process. It is noted that FIG. 6 is a schematic view in which the LED chip is not illustrated. Similarly, the manufacturing process can include cutting the dashed-line part of the semi-finished product in the figure using a milling cutter or a diagonal pliers to form the two second ends 22, 32 of the first and second metal supporting frames 2, 3 in such a manner that the two second ends 22, 32 share the same plane with the supporting stand 423.

Figure 7:
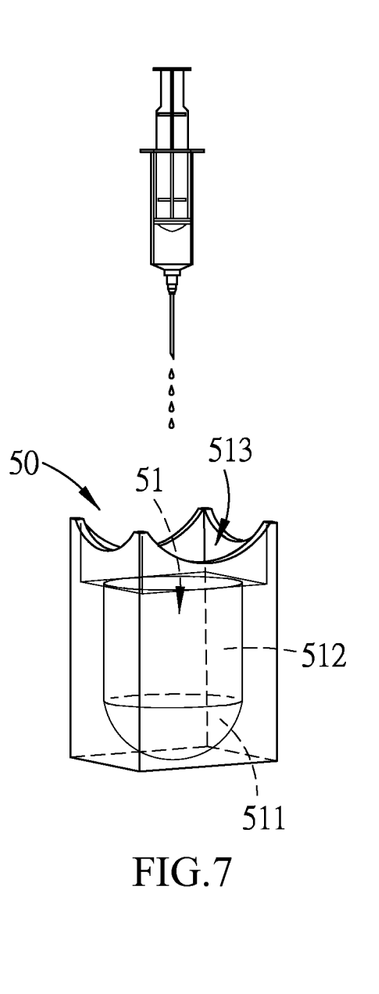
FIG. 7 is a semi-transparent isometric view illustrating one of the steps in the manufacturing method of the SMD type LED package device, in which an encapsulant is injected into a mold cavity.

The manufacturing method of the SMD type LED package device in this embodiment is not limited to what is described hereinbefore. The SMD type LED package device can also be formed after repeated molding process. That is to say, at first, inject the encapsulant that forms only a part of the packaging body, and then insert an assembly of the first metal supporting frame 2, the second metal supporting frame 3 and the LED chip 10. Next, inject once again some encapsulant and proceed with curing process to form a complete packaging body 4. It is noted that, with reference to FIG. 5 and FIG. 7, the mold cavity 51 comprises a cave bottom part 511, a main body part 512 and a close-to-the-opening supporting portion forming part 513 that are sequentially connected, wherein the encapsulant is injected into the cave bottom part and the main body part to form the lens portion, and the encapsulant injected into the supporting portion forming part rises by capillary action to form the supporting stand.

Another manufacturing method of the SMD type LED package device according to the present invention is to utilize a traditional LED package device with smaller external diameter, in which the exterior of the traditional LED packaging device forms the supporting portion and thus is compatible for SMT manufacturing process. More specifically, after the mold cavity is injected with the encapsulant, plug the traditional LED package device with smaller external diameter into the mold cavity, and after the curing process, perform mold release to obtain a semi-finished product. Finally, cut the semi-finished product according to the above-mentioned method and thereby the SMD type LED package device 1 of the present invention is obtained.

In summary, the present invention provides an LED package device 10 that is, without the aid of additional components, compatible with SMT manufacturing process by utilizing the supporting portion 42 of the packaging body 4 along with the two metal supporting frame 2 and 3, by which the present invention solves the long-time problem in prior art and thus achieve the object of the present invention.

The above description is only the explanation of the preferred embodiments of the present invention. A person with ordinary skills in the art can make various variations and modifications with reference to the above description. Nevertheless, the variations and modifications of the present invention should still fall within the scope of the present invention.

What is claimed is:

1. A surface-mount-device (SMD) type light-emitting diode (LED) package device, comprising:
   an LED chip;
   a first metal supporting frame having a first end on which the LED chip is mounted and a second end opposite to the first end on a first axis;
   a second metal supporting frame, which is spaced apart from the first metal supporting frame, having a first end of the second metal supporting frame and a second end which is disposed oppositely to the first end of the second metal supporting frame on the first axis, wherein the LED chip is electrically connected to the first end of the second metal supporting frame through a conducting wire; and
   a packaging body,
   wherein the packaging body includes:
   a lens portion, which covers the LED chip, the first end of the first metal supporting frame and the first end of the second metal supporting frame, and the lens portion having a light-emitting surface whose center is an optical axis extending along the first axis, and
   a supporting portion, integrally formed with the lens portion on a side opposite to the light-emitting surface of the lens portion, the supporting portion including: a circumferential surface which surrounds the optical axis, and a bottom surface which is adjacent to the circumferential surface and which is disposed on a side far away from the lens portion, wherein the bottom surface is inward-curved and a plurality of points on the bottom surface forms a supporting stand on a predetermined assembling plane in such a manner that a space is formed between the bottom surface and the predetermined assembling plane, and the second end of the first metal supporting frame extends outwardly from the bottom surface through the space to be in the same level of the predetermined assembling plane, and the second end of the second metal supporting frame extends outwardly from the bottom surface through the space to be in the same level of the predetermined assembling plane.

2. The SMD type LED package device as claimed in claim 1, wherein the supporting portion of the packaging body includes the supporting stand which is annular shaped and is defined by enormous numbers of points on the bottom surface.

3. The SMD type LED package device as claimed in claim 1, wherein the supporting portion of the packaging body includes the supporting stand which is defined by a plurality of points spaced apart from each other on the bottom surface.

4. The SMD type LED package device as claimed in claim 1, wherein the angle between the predetermined assembling plane and the first axis is in a range from 60° to 90°.

5. The SMD type LED package device as claimed in claim 1, wherein a silhouette of the supporting portion of the packaging body projected from a projection direction along the first axis is a polygon, and the supporting portion further includes a plurality of supporting stands which are respectively located at the vertices of the polygon.

6. A light-emitting apparatus, comprising at least one circuit board substrate and at least one SMD type LED package device which is assembled on the circuit board substrate via surface-mount technology manufacturing process, wherein the SMD type LED package device comprises:
   an LED chip;
   a first metal supporting frame having a first end on which the LED chip is mounted and a second end opposite to the first end on a first axis;
   a second metal supporting frame, which is spaced apart from the first metal supporting frame, having a first end of the second metal supporting frame and a second end which is disposed oppositely to the first end of the second metal supporting frame on the first axis, wherein the LED chip is electrically connected to the first end of the second metal supporting frame through a conducting wire; and
   a packaging body,
   wherein the packaging body includes:
   a lens portion, which covers the LED chip, the first end of the first metal supporting frame and the first end of the second metal supporting frame, and the lens portion having a light-emitting surface whose center is an optical axis extending along the first axis, in which the light emitted from the LED chip goes through the lens portion and is refracted and radiated through the light-emitting surface within a specific range of emergence angle; and
   a supporting portion, integrally formed with the lens portion on a side opposite to the light-emitting surface of the lens portion, wherein the supporting portion includes: a circumferential surface which surrounds the optical axis, and a bottom surface which is adjacent to the circumferential surface and which is disposed on a side far away from the lens portion, wherein the bottom surface is inward-curved and a plurality of points on the bottom surface forms a supporting stand on a predetermined assembling plane in such a manner that a space is formed between the bottom surface and the predetermined assembling plane, and the second end of the first metal supporting frame extends outwardly from the bottom surface through the space to be at the same level of the predetermined assembling plane and the second end of the second metal supporting frame extends outwardly from the bottom surface through the space to be at the same level of the predetermined assembling plane, the LED package device is mounted on the surface of the circuit board substrate by connecting the supporting stand and the second ends to the circuit board substrate.

\* \* \* \* \*